United States Patent
Huber

(10) Patent No.: US 11,297,715 B2
(45) Date of Patent: Apr. 5, 2022

(54) SOLDERABLE CIRCUIT BOARD MODULE SYSTEM

(71) Applicant: PHYTEC Messtechnik GmbH, Mainz (DE)

(72) Inventor: Bodo Huber, Undenheim (DE)

(73) Assignee: PHYTEC Messtechnik GmbH, Mainz (DE)

( * ) Notice: Subject to any disclaimer, the term of this patent is extended or adjusted under 35 U.S.C. 154(b) by 0 days.

(21) Appl. No.: 17/207,913

(22) Filed: Mar. 22, 2021

(65) Prior Publication Data
US 2021/0307169 A1    Sep. 30, 2021

(30) Foreign Application Priority Data
Mar. 25, 2020    (DE) .................... 10 2020 108 239.8

(51) Int. Cl.
H05K 1/16    (2006.01)
H05K 1/14    (2006.01)
H05K 1/02    (2006.01)

(52) U.S. Cl.
CPC ........... *H05K 1/141* (2013.01); *H05K 1/0215* (2013.01); *H05K 1/144* (2013.01); *H05K 2201/10659* (2013.01); *H05K 2201/10719* (2013.01)

(58) Field of Classification Search
CPC ...... H05K 1/141; H05K 1/0215; H05K 1/144; H05K 2201/10659; H05K 2201/10719
USPC ........................................................ 174/260
See application file for complete search history.

(56) References Cited

U.S. PATENT DOCUMENTS

| 5,956,233 | A  | * | 9/1999  | Yew ....................... H05K 7/023 361/760 |
| 7,170,314 | B2 | * | 1/2007  | Haba ..................... G06F 13/409 174/250 |
| 8,737,080 | B2 |   | 5/2014  | Zhang et al.                              |
| 9,510,461 | B2 |   | 11/2016 | Lee et al.                                |

OTHER PUBLICATIONS

"Manufacturing with the Land Grid Array Package", Freescale Semiconductor, Document No. AN2920, Rev. 2, Dec. 2008, 16 pages.
"Soldering Guidelines for Land Grid Array Packages", Peregrine Semiconductor, Application Note 61, 2016, 12 pages.
LGA Mounting Manual, Renesas Electronics, Rev 1.00, Mar. 2014, 22 pages.

* cited by examiner

*Primary Examiner* — Andargie M Aychillhum
(74) *Attorney, Agent, or Firm* — Collard & Roe, P.C.

(57) ABSTRACT

A solderable circuit board module system includes at least a first solderable circuit board module and a second solderable circuit board module, wherein the first solderable circuit board module has a first module circuit board having a top side and an underside provided for placement on a motherboard, wherein on the underside of the first module circuit board, solder connection contacts are arranged in a first frame-shaped contact region around a central middle section, which is free of connection contacts. The second solderable circuit board module has additional solder connection contacts, which form an outer frame around the first frame-shaped contact region, as a second group.

13 Claims, 3 Drawing Sheets

SOLDERABLE CIRCUIT BOARD MODULE SYSTEM

CROSS REFERENCE TO RELATED APPLICATIONS

Applicant claims priority under 35 U.S.C. § 119 of German Application No. 10 2020 108 239.8 filed Mar. 25, 2020, the disclosure of which is incorporated by reference.

BACKGROUND OF THE INVENTION

1. Field of the Invention

The present invention relates to the design of circuit boards that can be used in different IT applications.

2. Description of the Related Art

Due to continuing development and technical improvement, microcomputers are increasingly being used in industrial machines and systems, vehicles of all types, medical technology devices, and, for example, also consumer goods. Colloquially the corresponding industrial development is also referred to as Industry 4.0, according to which ever more data are being collected, processed, and linked with one another. In the case of motor vehicles and household appliances, for example, corresponding computer systems are used for control and for convenience functions, for example. Furthermore, linking of devices with one another or by way of a suitable data connection is also increasingly taking place. Corresponding developments are also described as a whole with the term Internet of Things.

For the applications described, computer devices and modules are made available in practice with microchips, connection interfaces, sensors as well as other active and passive components, which can be grouped together using the term Embedded Systems. Sub-groups of this are, for example, singleboard computers that form a complete computer unit, or a System on Module, which is intended to be combined with further modules or a motherboard.

In the case of the applications described, it is often practical to implement specific components, including microchips and microcontrollers, as well as related computing processes, on a module circuit board, wherein this module circuit board is arranged on a motherboard as a component. Depending on the requirements, modules having different designs can be selected in this way in the case of a motherboard. Furthermore, specific modules can also be combined with different motherboards.

Different approaches are known from practice for contacting such a module circuit board on a motherboard. With regard to connecting and subsequently replacing them, plug-in bases or plug-in strips are advantageous, wherein this method of connection is connected with high costs, on the other hand, and also leads to an undesirably high construction height due to the additional mechanical parts. Furthermore, plug-in connectors have proven to be possible defect sources in the case of demanding applications. This particularly holds true if the overall arrangement is subjected to shocks, vibrations, and other mechanical stresses during use. For example, minimization of plug-in connectors is aimed at in the automotive industry, specifically in the sector of microelectronics. Other ambient conditions, for example variations in humidity and temperature, and contaminations are also possible causes for failure in the case of plug-in connections.

Furthermore, it is also already known to arrange modules on a motherboard, for example, by means of soldering them, so that such a module is referred to as a solderable circuit board module within the scope of the invention. The failure rate of the system is reduced due to the soldered connections. Therefore an increase in reliability and the mean operational period between failures (MTBF "Mean Time Between Failures") occurs.

In order to allow soldering of such a solderable circuit board module, contacts can be arranged on an underside, in a predetermined pattern, wherein then, an assigned solder bead is then provided for each contact point. Corresponding embodiments are also referred to as a Ball Grid Array in practice. Even though such an embodiment is also fundamentally possible within the scope of the invention, the disadvantage occurs that relatively a lot of additional material becomes necessary due to the solder beads, and that under some circumstances, an increased construction height can occur. Also, application of the solder beads in a separate method step is complicated.

According to an alternative variant known from the state of the art and preferred within the scope of the invention, solder connection contacts are present as conductor tracks on the underside, coated with solder paste. Such an embodiment is also referred to in practice as a pre-tinned ([in English:] "pre-tinned") Land Grid Array, and various instructions and processing hints are available in this regard. As an example, reference is made to the documents "Manufacturing with the Land Grid Array Package," Freescale Semiconductor, Document Number AN2920, Rev. 2, December 2008, "Soldering Guidelines for Land Grid Array Packages," Peregrine Semiconductor, Application Note 61, and "LGA Mounting Manual," Renesas Electronics, Rev. 1.00, March 2014. Because preceding attributes lead to lack of clarity in the case of abbreviations, in the following, instead of the term LGA or pre-tinned LGA, the term FTGA (Fused Tin Grid Array) will also be used.

Solder connection modules are furthermore also known from the documents U.S. Pat. Nos. 9,510,461 B2 and 8,737,080 B2.

In this regard, U.S. Pat. No. 8,737,080 B2 describes a solderable circuit board module, which has a module circuit board having a top side and an underside. On the underside of the module circuit board, a plurality of solder connection contacts is arranged in a frame-shaped contact region around a central middle section, which is free of solder connection contacts. At the solder connection contacts, the solderable circuit board module is connected with corresponding counter-contacts of a motherboard. The solderable circuit board module has a plurality of components that are separate from one another, both on its top side and on its underside, in each instance. On the top side, passive and active components, including ICs, microcontrollers, and processors are usually arranged. On the underside, exclusively or mainly passive components are preferably provided, even though the placement of active components is also possible. For example, capacitors for stabilizing the voltage supply can be provided as passive components on the underside, which are then placed precisely opposite processors arranged on the top side, so as to allow short connection paths. Such an arrangement is frequently also recommended or required by the processor manufacturer. The corresponding components are contacted, on the underside, with the assigned module circuit board, within the frame composed of solder connection contacts, wherein here, soldering is also usually provided. Within the scope of the invention, these contacts and connectors are, however, differentiated from the previously defined solder connection contacts. Within the scope of the invention, only the contacts with which the solderable circuit board module and a motherboard are electrically and mechanically connected are referred to as solder connection contacts. Because the components provided on the underside of the solderable circuit board module project downward there, the solder connection contacts cannot be laid directly onto an assigned closed surface of the motherboard. For this reason, either an opening in the motherboard (FIG. 3 of U.S. Pat. No. 8,737,080 B2) or a frame-shaped spacer element (FIG. 4 of U.S. Pat. No. 8,737,080 B2) must be provided.

The size of the solderable circuit board module as well as the number of required solder connection contacts can be determined in accordance with the corresponding requirements, wherein then the motherboard must be adapted accordingly for holding the solderable circuit board module. As a result of a corresponding adaptation to the respective requirements, a significant development effort can occur.

SUMMARY OF THE INVENTION

Against this background, the present invention is based on the task of reducing the development effort, wherein different combinations of solderable circuit board modules and motherboards are also supposed to be made possible in simple manner.

The solution for the task is a solderable circuit board module system in accordance with the invention.

The invention accordingly relates to a solderable circuit board module system having at least a first solderable circuit board module and a second solderable circuit board module, wherein the first solderable circuit board module has a first module circuit board having a top side and an underside provided for placement on a motherboard, wherein a plurality of solder connection contacts is arranged in a first frame-shaped contact region around a central middle section that is free of solder connection contacts, on the underside of the first module circuit board, wherein the second solderable circuit board module has a second module circuit board having a top side and an underside provided for placement on a motherboard, wherein a first group of solder connection contacts is arranged on the underside of the second module circuit board, in an arrangement in accordance with the first frame-shaped contact region of the first module circuit board, and a second group of solder connection contacts is arranged, wherein the solder connection contacts of the second group are arranged around the first frame-shaped contact region as an outer frame.

Thereby a solderable circuit board module system is made available, which can be scaled in at least two different sizes with a different number of solder connection contacts, in accordance with the respective requirements. The second solderable circuit board module therefore has additional solder connection contacts as an outer frame, so that a larger base area also occurs. In spite of this scaling, the first frame-shaped contact region is structured the same for both embodiments for the two different sizes of the first solderable circuit board module or the first module circuit board, on the one hand, and the second solderable circuit board module or the corresponding second module circuit board, on the other hand, so that as a result, a certain standardization occurs for both sizes. This can preferably be provided not only for the placement and number of solder connection contacts, but also, in particular, also for their layout, so that then, adaptations and modifications of the functionality of different solderable circuit board modules are easily possible. Even in the case of design of different solderable circuit board modules for different functions and purposes of use, as well as in the case of the different sizes described, fundamental circuitries and connection schematics can be taken over.

In the case of a uniform determination of the placement and number of solder connection contacts in the case of the first solderable circuit board module, on the one hand, and in the case of the second solderable circuit board module, on the other hand, the most varied combinations of module circuit boards and motherboards are possible in simple manner.

Since the first frame-shaped contact region and, in the case of the second solderable circuit board module, the second group of solder connection contacts, are arranged around the central middle section as an outer frame, not only particularly great stability but also good force distribution occur as the result of soldering. In this regard, the solder connection contacts are preferably arranged, both in the case of the first frame-shaped contact region and also in the case of the outer frame, in the form of rows that are closed on the circumference. In this regard, particularly preferably, the central middle section also forms the largest cohesive and, in particular, approximately rectangular surface area on which no solder connection contacts are provided.

Preferably the first frame-shaped contact region has between 300 and 540, particularly between 360 and 430, for example 394 solder connection contacts.

According to a preferred embodiment of the invention, the outer frame can have between 145 and 242, in particular between 170 and 220, for example 194 solder connection contacts. The number of solder connection contacts of the second solderable circuit board module then results from the sum of the stated values, because there, the outer frame is arranged around the first frame-shaped contact region. Taking the boundary values indicated above into consideration, the second solderable circuit board module has, for example, between 425 and 750, in particular between 540 and 635 solder connection contacts.

Even though the shape of the first module circuit board as well as of the second module circuit board is fundamentally not restricted, a usual rectangular shape is preferred for practical reasons. In this regard, the base surface covered by the first module circuit board and/or the second module circuit board can be, in particular, square or approximately square.

The surface area of the first module circuit board typically lies in a range between 1200 mm$^2$ and 1800 mm$^2$. The base surface covered by the second module circuit board can lie, for example, between 1800 mm$^2$ and 2600 mm$^2$. Taking into consideration the parameters indicated above, the surface area covered by the second module circuit board is preferably at least 30% greater than the surface area covered by the first module circuit board.

The solder connection contacts are connected with one another differently and can be assigned, for example, to grounding, to a power supply or to a signal. In this regard, the term signal can be interpreted broadly and, of course, also comprises connections for normalized and standardized communication protocols such as, for example, Ethernet/LAN, USB, UART, GPIO, a CAN Bus, a Wireless Interface, analog connections or the like.

Against this background, a further particularly advantageous aspect of the present invention relates to the number and arrangement of the grounding connections. Thus, according to a preferred embodiment of the invention, it is provided that a plurality of the solder connection contacts form grounding connections, wherein in the case of the first solderable circuit board module and the second solderable circuit board module, with reference to the total number of solder connection contacts, the proportion of grounding connections lies between 10% and 35%, in particular between 18% and 27%. In this regard, the grounding connections can be laid in such a manner that ultimately, every signal connection is situated adjacent to or at least in the vicinity of a grounding connection. Viewed geometrically, for example, typically between two and four signal connections can share a grounding connection.

With regard to the arrangement of the solder connection contacts, the distances relative to one another will be discussed below. In the case of the individual solder connection contacts, the distances always relate to the center point of the corresponding conductive surface. In the case of a usual circular shape of the individual solder connection contacts, the center must therefore always be used, so as to be able to determine the "center to center" distance.

According to a preferred embodiment of the invention, it is provided that for every solder connection contact that is not a grounding connection, the distance from a closest grounding connection is less than twice the distance from a next adjacent solder connection contact. In particular, the distance is less than 1.5 times, particularly preferably less than 1.2 times as great. For example, it can be provided that all the solder connection contacts are arranged in a raster composed of rows, wherein the smallest distance between the solder connection contacts also corresponds to the distance between the rows, which run parallel to one another, wherein, however, the rows that follow one another are set with a gap, more or less. Therefore if, for example, the smallest distance between adjacent solder connection contacts as well as the distance between rows corresponds to a first value a, then for every solder connection contact that is not a grounding connection, the next closest grounding connection can be arranged either as a direct neighbor or, in the following row, offset by half the distance. The distance then amounts to $$a * \frac{\sqrt{5}}{2} \approx 1.12 * a.$$

As a result of the number and arrangement of the grounding connections as described, short connections paths can be implemented. In particular, the electromagnetic compatibility (EMV) of the solderable circuit board module system can also be improved. As a result of the uniform arrangement of grounding connections, low susceptibility to electromagnetic interference influences can be achieved, wherein an emission of electromagnetic radiation can also be reduced to a great extent. Furthermore, the distribution of the grounding connections allows optimization of the signal integrity and thereby contributes to increasing the reliability of the system.

These advantages can be further improved by means of measures described in greater detail below.

Thus, it is usually provided that the first module circuit board and/or the second module circuit board are structured with multiple layers. For example, a number of layers between 4 and 18, in particular between 6 and 12 intermediate layers, is typical, wherein the present invention can also be used, in practical manner, at a lower or higher number of layers. In the case of the typical multi-layer structure of the first and/or the second module circuit board, conductor tracks, a grounding layer or also a power supply layer can be provided on the individual layers. In total—as will be explained in greater detail below—multiple grounding layers and/or power supply layers can be provided.

With regard to good shielding and, in total, good electromagnetic compatibility, it is advantageous if at least one inner grounding layer extends over a large part of the base surface covered by the corresponding module circuit board. For example, it can be provided that the conductive layer connected with the grounding or the coating of the grounding layer extends over 80% of the surface area, at first. It is practical if the grounding connections are connected with the at least one grounding layer directly. Good shielding is achieved by means of at least one extensive grounding layer. Such shielding is even further improved by means of placing multiple grounding layers. In the case of a multi-layer structure, a grounding layer can be provided, for example, relatively far at the top and relatively far at the bottom (in particular, as the first and last inner layer), so that then, shielding can be achieved also for the intermediate space.

The grounding properties can be further improved in that the at least one grounding layer is brought to just in front of the edge of the assigned module circuit board or particularly preferably directly up to the edge. If the module circuit board is then also provided with circumferential metallization, almost complete shielding occurs for the enclosed space.

A further aspect of the present invention concerns itself with the solderability of the solderable circuit board modules as well as with the strength achieved thereby. As has already been explained above, the frame-shaped arrangement of the solder connection contacts already results in relatively good stability. In order to allow a low construction height, to keep the use of solder low, to allow easy handling, and to keep the costs low, according to a preferred embodiment of the invention the solder connection contacts are structured as conductor surfaces of a Land Grid Array pre-coated with solder paste, wherein such an embodiment is also referred to, within the scope of the invention, as FTGA. Soldering can then take place in different ways. Reflow soldering, in which the solderable circuit board module is heated so strongly that the solder contained in the solder paste melts, is particularly preferred.

In practice, the demand can also occur to remove the solderable circuit board module from the motherboard once again, in particular so as to separately check, overhaul and/or replace the solderable circuit board module. Differently from a connection by means of a plug-in base, desoldering is then necessary, wherein, however, at least impairment of the motherboard must be avoided. If, as described above, at least one extensive grounding layer composed of metallic, conductive material is provided on the module circuit board, then this layer can also be used for heat transfer, in particularly advantageous manner, also during desoldering. Also, desoldering is further simplified if the module circuit board being considered, in each instance, has an edge-side metallization.

As has already been described above, in the case of the solderable circuit board module system a first predetermined size is provided for the first solderable circuit board module, and a second predetermined size is provided for the second solderable circuit board module. Therefore grippers or tongs adapted to the size can also be made available, by way of which at least part of the heat is introduced during desoldering, and using which the solder connection modules can be removed from the motherboard.

According to a further aspect of the present invention, a metallization can be provided at the corners, in each instance, on the underside of the first module circuit board and/or on the underside of the second module circuit board. Such a metallization can be included in soldering, so that particularly great strength and stability can be achieved, specifically, by means of fixation of these corners. In this regard, the metallizations can also be contacted with the grounding connections and, in particular, with an inner grounding layer, so as to increase the strength, improve the grounding, and also to optimize the properties of heat conduction. For many applications, the greater mechanical strength stands in the foreground. Specifically as the result of soldering of metallizations at the corners, very good resistance to vibrations and shocks occurs, which regularly occur, for example, in vehicles and in various industrial applications.

With regard to soldering, reference is also made to the technical literature cited initially.

As has also been explained with regard to the state of the art, the first module circuit board and the second module circuit board have multiple components, separate from one another, on their top side and preferably also on the underside, in each instance, in the region of the central middle section, wherein these can be, for example, processors, microcontrollers, ICs as well as all types of passive components, including sensors, antennas or the like. In this regard, it is preferred to place active components such as processors, microcontrollers, and ICs on the top side, along with further passive components, while only passive components are provided on the underside.

The solderable circuit board module system according to the invention relates, on the one hand, to a first solderable circuit board module and a second solderable circuit board module, which are provided for placement on a motherboard, as well as, on the other hand, to the overall system formed after a connection with the motherboard. The solderable circuit board module system then also has the motherboard onto which the first module circuit board and/or the second module circuit board is/are set. In order to allow placement of components on the underside of the first module circuit board and/or the second module circuit board, an opening can be provided there in the region of the central middle section, in the case of the motherboard.

The present invention relates, according to the above explanations, to a solderable circuit board module system having a first solderable circuit board module and a second solderable circuit board module, which have a different number of solder connection contacts and usually also a different size. As an example, in this connection, the smaller first solderable circuit board module can be assigned a size M (medium), and the second, larger solderable circuit board module can be assigned a size L (large).

For specific applications, however, it can also be practical to make even smaller or larger dimensions of a solderable circuit board module available. In order to implement smaller dimensions, for example, the first solderable circuit board module (M) can be cut in half along an axis of symmetry, wherein then, at least the solder connection contacts that run directly along the cutting line must also be left out. However, the remaining solder connection contacts can be retained, in terms of their arrangement preferably also in terms of their assignment. In the case of such a small solderable circuit board module (for example size S—small), the solder connection contacts then extend in C shape around the halved central middle section, which then, however, is arranged offset in the direction of an edge on the scaled-down solderable circuit board module and open toward the corresponding edge.

On the other hand, purposes of use are also conceivable, in which even the second solderable circuit board module is too small. It can be problematic, in this regard, in particular, that the base surface covered by the second solderable circuit board module is not large enough to be able to place all of the components on the top side as well as on the underside of the assigned module circuit board. Even in the case of such constellations, however, the number of solder connection contacts is usually sufficient in the case of the second solderable circuit board module, so that then it is practical to merely increase the base surface of the solderable circuit board module, so that then a solderable circuit board module having the size XL (extra large) is made available.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings.

DETAILED DESCRIPTION OF PREFERRED EMBODIMENTS

Figure 1:
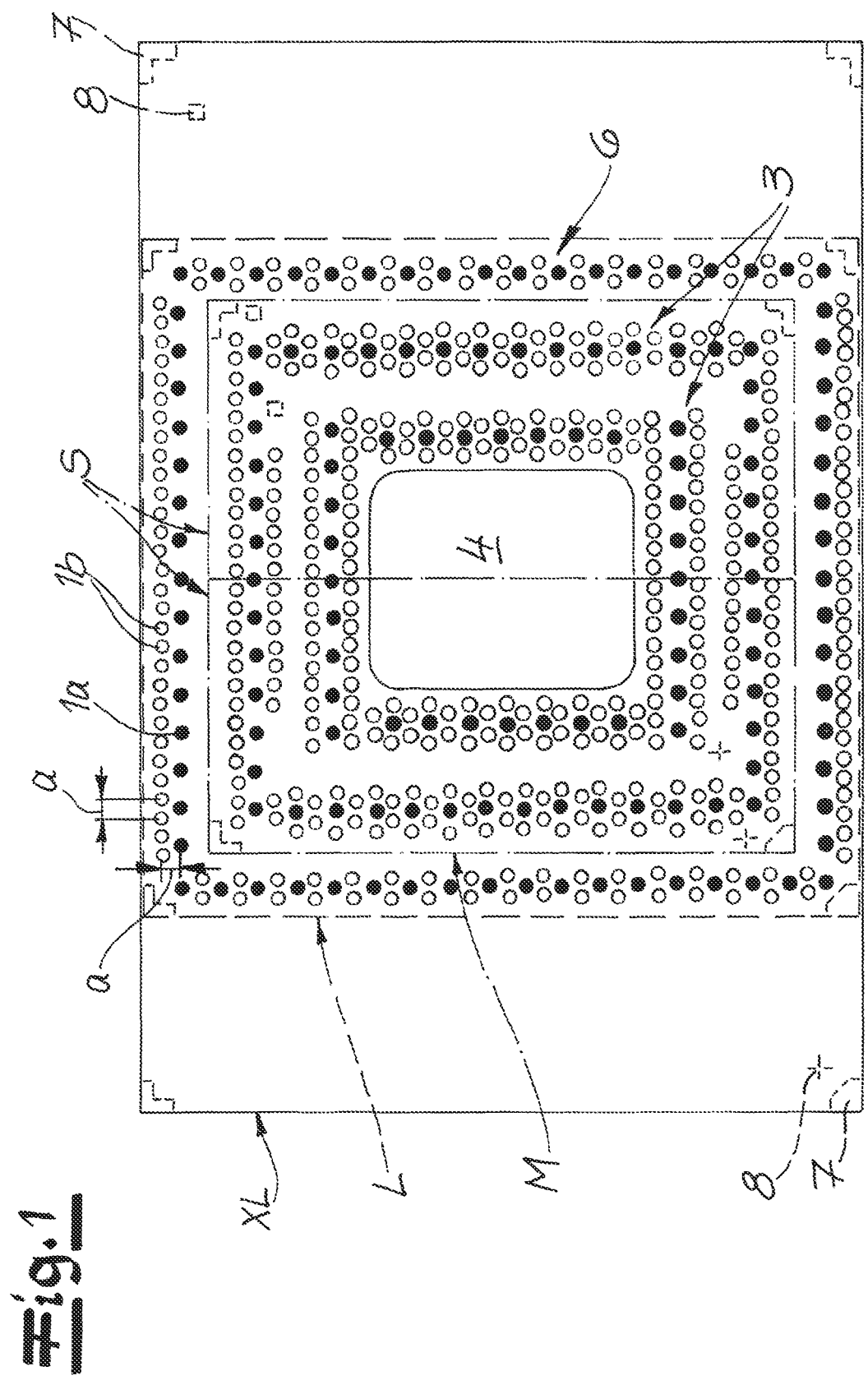
FIG. 1 shows the arrangement of solder connection contacts for forming solder connection modules of different sizes, FIG. 2, proceeding from FIG. 1, shows, separately from one another, solder connection modules of different sizes.

FIG. 1 shows the arrangement of solder connection contacts 1a, 1b for different sizes of solderable circuit board modules S, M, L, XL. The two largest solderable circuit board modules XL, L comprise all of the solder connection contacts 1a, 1b shown. The smaller solderable circuit board module M, referred to as the first solderable circuit board module in the following, comprises only the solder connection contacts 1a, 1b arranged within the corresponding line. The smallest solderable circuit board module S, in contrast, is halved in size, wherein also the cut solder connection contacts as well as the directly adjacent solder connection contacts are left out.

The solder connection contacts 1a, 1b are shown differently, so as to make their function clear. The solder connection contacts 1a, shown as filled circles, are provided as grounding connections, while the other solder connection contacts 1b, shown as open circles, form signal connections or voltage connections. Optically, the solder connection contacts 1a, 1b on the underside of the solderable circuit board modules S, M, L, XL cannot be differentiated. The solder connection contacts 1a, 1b are structured, for example, as Fused Tin Grid Array (FTGA), wherein the conductor surfaces of a Land Grid Array are pre-coated with solder paste.

From FIG. 1, it is evident that the solder connection contacts 1a, 1b are arranged in an extensively uniform raster. The smallest distance a between adjacent solder connection contacts 1a, 1b also corresponds to the distance between consecutive rows, but these are arranged offset from one another. The indicated distances a always relate to the surface area center points, in other words the center of the circular solder connection contacts, in each instance. It can be seen that at practically all locations, 2 to 4 solder connection contacts that are not grounding connections geometrically share an adjacent grounding connection. Accordingly, the proportion of solder connection contacts typically amounts to between 10% and 30%.

In the concrete exemplary embodiment, in total 588 solder connection contacts 1a, 1b are provided, wherein of these, 148 solder connection contacts 1a are grounding connections. For the further explanation, the solderable circuit board module M having a medium size is referred to as the first solderable circuit board module. In the exemplary embodiment, the first solderable circuit board module M comprises, in total, 394 solder connection contacts 1a, 1b, of which 82 solder connection contacts 1a form grounding connections. The first solderable circuit board module M comprises a first module circuit board having a top side as well as an underside shown in FIG. 1, which is intended for placement on a motherboard 2 (see FIGS. 3A and 3B). On an underside of the first module circuit board, the solder connection contacts 1a, 1b are arranged in a first frame-shaped contact region 3 around a central middle section 4, which is free of solder connection contacts 1a, 1b. As is also evident from FIG. 3B, components 5 are present on the middle section 4, but these are merely indicated in FIG. 3B. These components 5 are also contacted on the underside shown in FIG. 1, in usual manner, by means of soldering, wherein, however, the corresponding contact locations are not referred to as solder connection contacts 1a, 1b within the scope of the invention, and therefore are also not shown in FIG. 1. Within the scope of the invention, the elements with which the solderable circuit board module S, M, L, XL is electrically and mechanically connected with the motherboard 2 are referred to as solder connection contacts 1a and 1b.

The second-largest solderable circuit board module L is referred to, within the scope of the figure description, as the second solderable circuit board module. It differs from the first solderable circuit board module M by its larger base surface, on the one hand, and by an additional second group 6 of solder connection contacts 1a, 1b, on the other hand, which are arranged as an outer frame around the first frame-shaped contact region 3.

As a result of the uniform arrangement of the solder connection contacts provided as grounding connections, particularly good grounding and electromagnetic compatibility occur, as does good signal integrity. This holds true, in particular, if, in accordance with a usual embodiment, the module circuit board of the solderable circuit board modules S, M, L, XL are configured in multiple layers and have at least one inner grounding layer.

In addition to the first solderable circuit board module M and the second solderable circuit board module L, the smallest solderable circuit board module S can be formed by halving, wherein then, the solder connection contacts 1a, 1b that lie precisely on the cutting line as well as directly adjacent to the cutting line should be left out during production. The largest solderable circuit board module XL is obtained in that the base surface is increased in size, wherein the arrangement of the solder connection contacts 1a, 1b remains as compared with the second-largest solderable circuit board module L. Alternatively, however, further solder connection contacts 1a, 1b can also be provided as required.

In FIG. 1, furthermore optional metallizations 7 are indicated at the corners; it is advantageous if these are provided at the four corners for all the solderable circuit board modules S, M, L, XL. Soldering can take place at the metallizations 7, as well, so that then, particularly advantageous fixation and stabilization is achieved, specifically at the corners. The metallization 7 can also be connected with an inner grounding layer, so as to improve grounding, on the one hand, and to allow improved heat conduction, on the other hand. Soldering preferably takes place by means of a reflow soldering process. The precise shape and size of the metallization 7 at the corners can be varied, wherein two practical variants for the largest solderable circuit board module XL are indicated.

However, within the scope of the invention, it can also be practical to subsequently remove the solderable circuit board modules S, M, L, XL from the motherboard again, for example to replace them, in other words to provide for desoldering. For example, the solderable circuit board modules S, M, L, XL can be gripped with a tool that grips onto the edge, in the manner of tongs, for this purpose, wherein this tool can then, in particular, also be heated and/or pre-heated. Of course, desoldering can also be achieved or supported by means of hot air, infrared radiation or the like, wherein a selective, spatially restricted introduction of heat is aimed at.

Figure 2:
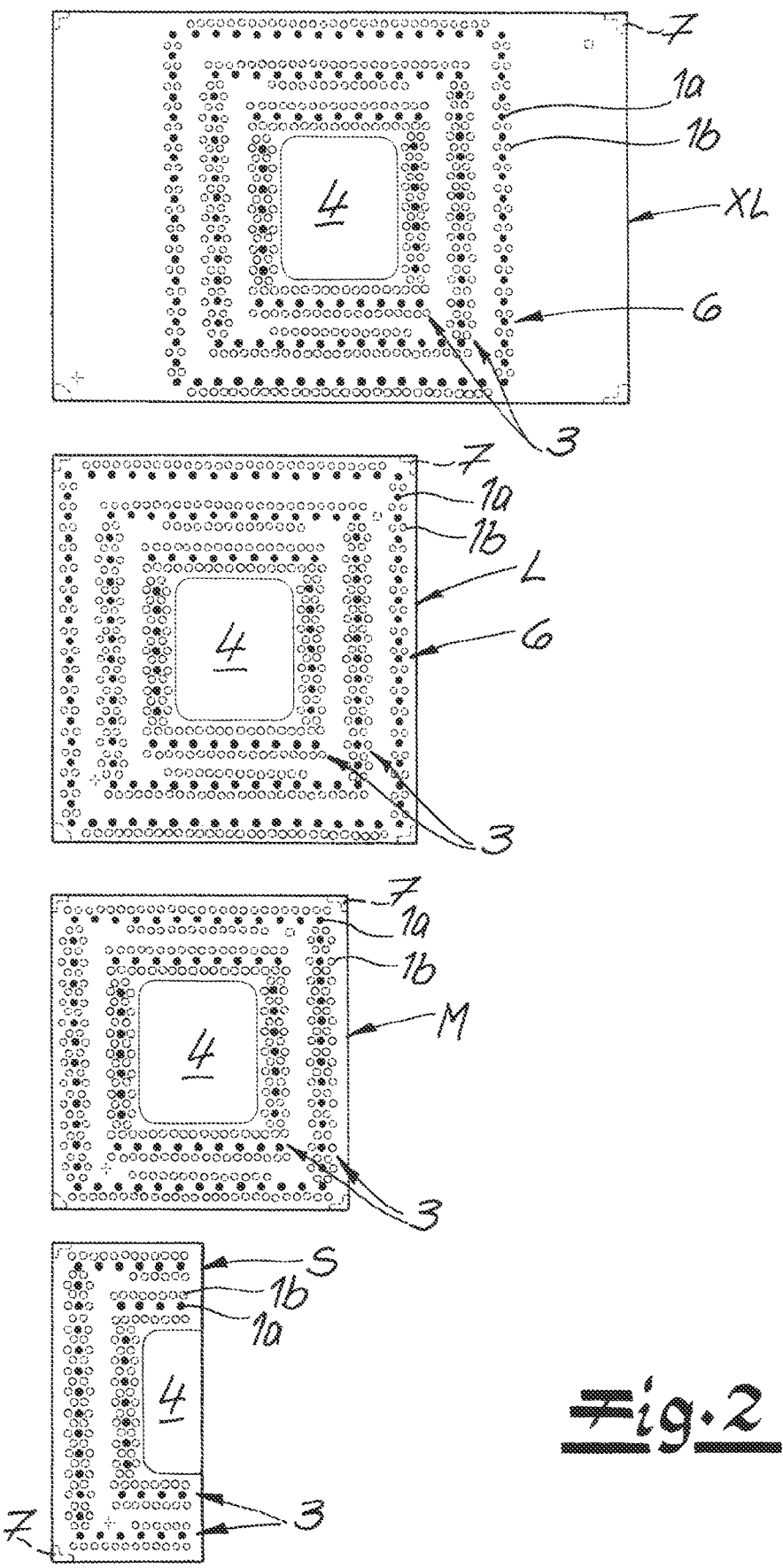

For better differentiation, in FIG. 2 the different solderable circuit board modules S, M, L, XL are shown separately from one another with regard to the solder connection contacts 1a, 1b on the underside. For the remainder, reference can be made to the explanations regarding FIG. 1.

For the sake of completeness, in FIG. 1 a position mark 8 is also indicated, which can be used in positioning. In addition to or as an alternative to a position mark 8, labels, inscriptions or the like can also be provided, so as to identify the corresponding solderable circuit board modules S, M, L, XL.

Figure 3A:
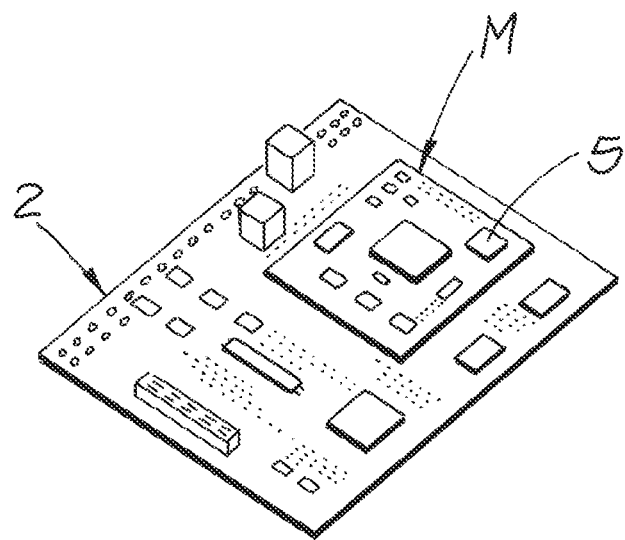
FIG. 3A shows the arrangement of a motherboard with a solderable circuit board module placed on it, in a view from above.
Figure 3B:
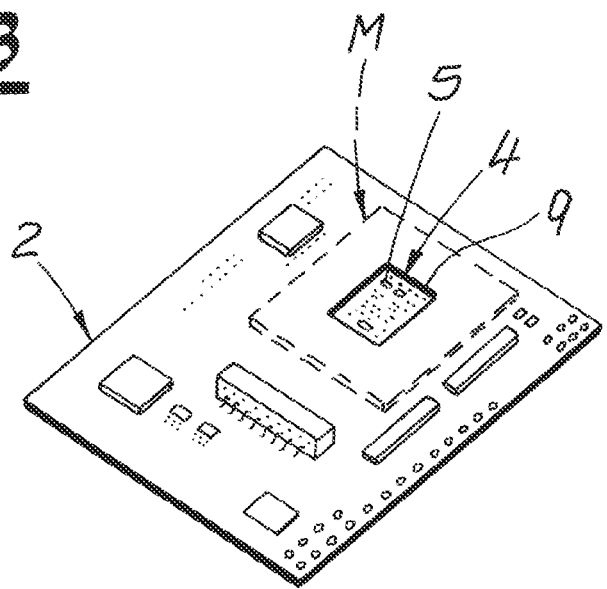
FIG. 3B shows the arrangement according to FIG. 3A, in a view from below.

FIGS. 3A and 3B show a first solderable circuit board module M in the typical arrangement on the motherboard 2. It is indicated that in the case of the solderable circuit board module, components 5 are arranged both on the top side and on the underside. In order to allow placement of the components 5 on the underside, the motherboard 2 according to FIG. 3B has an opening 9 in the region of the middle section 4. In this regard, the opening 9 can also be used for the purpose of conducting heat by means of hot air or a contact directly to the solderable circuit board module M or the solder connection contacts 1a, 1b if desoldering occurs.

Although only a few embodiments of the present invention have been shown and described, it is to be understood that many changes and modifications may be made thereunto without departing from the spirit and scope of the invention.

The invention claimed is:

1. A solderable circuit board module system having at least a first solderable circuit board module and a second solderable circuit board module, wherein the first solderable circuit board module has a first module circuit board having a top side and an underside provided for placement onto a motherboard, wherein a plurality of solder connection contacts are arranged on the underside of the first module circuit board, in a first frame-shaped contact region around a central middle section, which is free of solder connection contacts, wherein the second solderable circuit board module has a second module circuit board having a top side and an underside provided for placement on a motherboard, wherein on the underside of the second module circuit board, a first group of solder connection contacts is arranged in an arrangement in accordance with the first frame-shaped contact region of the first module circuit board, and a second group of solder connection contacts is provided, wherein the solder connection contacts of the second group are arranged as an outer frame around the first frame-shaped contact region, wherein a plurality of the solder connection contacts form grounding connections, and wherein in the case of the first solderable circuit board module and the second solderable circuit board module, the proportion of the grounding connections lies between 10% and 35%, with reference to the total number of solder connection contacts.

2. The solderable circuit board module system according to claim 1, wherein the first frame-shaped contact region has between 300 and 540 solder connection contacts.

3. The solderable circuit board module system according to claim 1, wherein the outer frame has between 145 and 242 solder connection contacts.

4. The solderable circuit board module system according to claim 1, wherein for every solder connection contact that is not a grounding connection, the distance from a closest grounding connection amounts to less than twice the distance from a nearest adjacent solder connection contact.

5. The solderable circuit board module system according to claim 1, wherein the first module circuit board and the second module circuit board have a rectangular shape.

6. The solderable circuit board module system according to claim 1, wherein the first module circuit board and/or the second module circuit board is/are structured in multiple layer, with at least one inner conductor track layer and one inner grounding layer.

7. The solderable circuit board module system according to claim 6, wherein the at least one inner grounding layer extends over at least 60% of the surface area covered by the assigned module circuit board.

8. The solderable circuit board module system according to claim 1, wherein on the underside of the first module circuit board and/or on the underside of the second module circuit board, at the corners, a metallization is provided.

9. The solderable circuit board module system according to claim 1, wherein a circumferential edge of the first module circuit board and/or a circumferential edge of the second module circuit board is provided with a metallization, at least in certain sections.

10. The solderable circuit board module system according to claim 1, wherein on the top side of the first module circuit board and the second module circuit board, multiple components are arranged, separately from one another.

11. The solderable circuit board module system according to claim 1, wherein components are arranged on the underside of the first module circuit board and/or the underside of the second module circuit board, on the central middle section.

12. The solderable circuit board module system according to claim 1, wherein the solder connection contacts are structured as conductor surfaces of a Land Grid Array, pre-coated with a solder paste.

13. The solderable circuit board module system according to claim 1, having a mother board onto which the first module circuit board and/or the second module circuit board is set, wherein the motherboard has an opening in the region of the central middle section.

* * * * *